(12) United States Patent
Sahar

(10) Patent No.: US 8,423,872 B2
(45) Date of Patent: Apr. 16, 2013

(54) METHOD FOR OPTIMIZING THE FORWARD ERROR CORRECTION SCHEME

(75) Inventor: Carmit Sahar, Tel Aviv (IL)

(73) Assignee: Harmonic Inc., San Jose, CA (US)

( * ) Notice: Subject to any disclaimer, the term of this patent is extended or adjusted under 35 U.S.C. 154(b) by 0 days.

(21) Appl. No.: 13/230,107

(22) Filed: Sep. 12, 2011

(65) Prior Publication Data

US 2012/0233525 A1    Sep. 13, 2012

Related U.S. Application Data

(63) Continuation of application No. 11/853,562, filed on Sep. 11, 2007, now Pat. No. 8,037,392.

(51) Int. Cl.
   *H03M 13/00*    (2006.01)
   *H04N 11/04*    (2006.01)

(52) U.S. Cl.
   USPC ....... 714/776; 714/751; 714/786; 375/240.27

(58) Field of Classification Search .................. 714/776, 714/751, 786; 375/240.27
   See application file for complete search history.

(56) References Cited

U.S. PATENT DOCUMENTS

| | | | | |
|---|---|---|---|---|
| 5,369,682 A * | 11/1994 | Witsaman et al. | ........... | 340/7.26 |
| 6,681,362 B1 * | 1/2004 | Abbott et al. | .................. | 714/755 |
| 7,539,187 B2 * | 5/2009 | Fellman et al. | ............... | 370/389 |
| 7,660,245 B1 * | 2/2010 | Luby | ............................. | 370/230 |
| 7,738,501 B2 * | 6/2010 | Repko et al. | .................. | 370/503 |
| 2008/0219151 A1 * | 9/2008 | Ma et al. | ......................... | 370/221 |
| 2008/0250299 A1 * | 10/2008 | Maillet et al. | ................. | 714/776 |
| 2010/0050057 A1 * | 2/2010 | Luby | ............................. | 714/776 |

OTHER PUBLICATIONS

Moon et al, Bit Rearrangement for MIMO Retransmissions, 2007, IEEE, pp. 3509-3513.*

* cited by examiner

*Primary Examiner* — John J Tabone, Jr.
(74) *Attorney, Agent, or Firm* — David R. Stevens; Stevens Law Group

(57) ABSTRACT

The present invention relates to a method for optimizing the FEC scheme comprising the steps of: (a) receiving a batch of data packets designated for transmission; (b) choosing a number of divisors having no common denominators in accordance with the said batch of data packets; (c) organizing into blocks said batch of data packets a number of times in accordance with the number of divisors using said divisors; and (d) creating a FEC packet for each of said blocks.

6 Claims, 4 Drawing Sheets

|   |   |   |   |   |
|---|---|---|---|---|
| 1 | 2 | 3 | 4 | 5 |
| 6 | 7 | 8 | *9* | 10 |
| 11 | 12 | 13 | 14 | 15 |
| 16 | 17 | 18 | 19 | 20 |
| 21 | *22* | 23 | 24 | 25 |
| 26 | 27 | 28 | 29 | 30 |
| 31 | 32 | 33 | 34 | 35 |
| 36 | 37 | 38 | 39 | 40 |
| 41 | 42 | 43 | 44 | 45 |
| 46 | 47 | *48* | 49 | 50 |
| 51 | 52 | 53 | 54 | 55 |
| 56 | 57 | 58 | 59 | 60 |
| 61 | 62 | 63 | 64 | 65 |
| 66 | 67 | 68 | 69 | 70 |
| 71 | 72 | 73 | 74 | *75* |
| 76 | 77 | 78 | 79 | 80 |
| 81 | 82 | 83 | 84 | 85 |
| 86 | 87 | 88 | 89 | 90 |
| *91* | 92 | 93 | 94 | 95 |
| 96 | 97 | 98 | 99 | 100 |

FEC1 FEC2 FEC3 FEC4 FEC5

Fig. 1a (Prior Art)

|   |   |   |   |   |
|---|---|---|---|---|
| 1 | 2 | 3 | 4 | 5 |
| 6 | 7 | 8 | 9 | 10 |
| 11 | 12 | 13 | 14 | 15 |
| 16 | 17 | 18 | 19 | 20 |
| *21* | 22 | 23 | 24 | *25* |
| 26 | 27 | 28 | 29 | 30 |
| 31 | 32 | 33 | 34 | 35 |
| 36 | 37 | 38 | 39 | 40 |
| 41 | 42 | *43* | *44* | 45 |
| 46 | 47 | *48* | *49* | 50 |
| 51 | 52 | 53 | 54 | 55 |
| 56 | 57 | 58 | 59 | 60 |
| 61 | 62 | 63 | 64 | 65 |
| 66 | 67 | 68 | 69 | 70 |
| 71 | 72 | 73 | 74 | 75 |
| 76 | 77 | 78 | 79 | 80 |
| *81* | 82 | 83 | 84 | *85* |
| 86 | 87 | 88 | 89 | 90 |
| 91 | 92 | 93 | 94 | 95 |
| 96 | 97 | 98 | 99 | 100 |

FEC1 FEC2 FEC3 FEC4 FEC5

Fig. 1b (Prior Art)

| | | | | | |
|---|---|---|---|---|---|
| 1 | 2 | 3 | 4 | 5 | FEC'1 |
| 6 | 7 | 8 | 9 | 10 | FEC'2 |
| 11 | 12 | 13 | 14 | 15 | FEC'3 |
| 16 | 17 | 18 | 19 | 20 | FEC'4 |
| 21 | 22 | 23 | 24 | 25 | FEC'5 |
| 26 | 27 | 28 | 29 | 30 | FEC'6 |
| 31 | 32 | 33 | 34 | 35 | FEC'7 |
| 36 | 37 | 38 | 39 | 40 | FEC'8 |
| 41 | *42* | *43* | *44* | *45* | FEC'9 |
| *46* | *47* | 48 | 49 | 50 | FEC'10 |
| 51 | 52 | 53 | 54 | 55 | FEC'11 |
| 56 | 57 | 58 | 59 | 60 | FEC'12 |
| 61 | 62 | 63 | 64 | 65 | FEC'13 |
| 66 | 67 | 68 | 69 | 70 | FEC'14 |
| 71 | 72 | 73 | 74 | 75 | FEC'15 |
| 76 | 77 | 78 | 79 | 80 | FEC'16 |
| 81 | 82 | 83 | 84 | 85 | FEC'17 |
| 86 | 87 | 88 | 89 | 90 | FEC'18 |
| 91 | 92 | 93 | 94 | 95 | FEC'19 |
| 96 | 97 | 98 | 99 | 100 | FEC'20 |

FEC1 FEC2 FEC3 FEC4 FEC5

Fig. 2 (Prior Art)

5x20 arrangement

```
 1   2   3   4   5
 6   7   8   9  10
11  12  13  14  15
16  17  18  19  20
21  22  23  24  25
26  27  28  29  30
31  32  33  34  35
36  37  38  39  40
41  42  43  44  45
46  47  48  49  50
51  52  53  54  55
56  57  58  59  *60*
*61* *62*  63  64  65
66  *67* *68* *69*  70
71  72  73  *74* *75*
*76*  77  78  79  80
*81* *82* *83*  84  85
86  87  88  89  90
91  92  93  94  95
96  97  98  99 100
```

9x11 arrangement

```
 1   2   3   4   5   6   7   8   9
10  11  12  13  14  15  16  17  18
19  20  21  22  23  24  25  26  27
28  29  30  31  32  33  34  35  36
37  38  39  40  41  42  43  44  45
46  47  48  49  50  51  52  53  54
55  56  57  58  59  *60* *61* *62*  63
64  65  66  *67* *68* *69*  70  71  72
73  *74* *75* *76*  77  78  79  80  *81*
*82* *83*  84  85  86  87  88  89  90
91  92  93  94  95  96  97  98  99
```

7x14 arrangement

| | | | | | |
|---|---|---|---|---|---|
| 1 | 2 | 3 | 4 | 5 | FEC'1 |
| 6 | 7 | 8 | 9 | 10 | FEC'2 |
| 11 | 12 | 13 | 14 | 15 | FEC'3 |
| 16 | 17 | 18 | 19 | 20 | FEC'4 |
| 21 | 22 | 23 | 24 | 25 | FEC'5 |
| 26 | 27 | 28 | 29 | 30 | FEC'6 |
| _31_ | 32 | 33 | 34 | 35 | FEC'7 |
| _36_ | _37_ | 38 | 39 | 40 | FEC'8 |
| 41 | _42_ | _43_ | 44 | 45 | FEC'9 |
| 46 | 47 | _48_ | _49_ | 50 | FEC'10 |
| 51 | 52 | 53 | _54_ | _55_ | FEC'11 |
| 56 | 57 | 58 | 59 | _60_ | FEC'12 |
| 61 | 62 | 63 | 64 | 65 | FEC'13 |
| 66 | 67 | 68 | 69 | 70 | FEC'14 |
| 71 | 72 | 73 | 74 | 75 | FEC'15 |
| 76 | 77 | 78 | 79 | 80 | FEC'16 |
| 81 | 82 | 83 | 84 | 85 | FEC'17 |
| 86 | 87 | 88 | 89 | 90 | FEC'18 |
| 91 | 92 | 93 | 94 | 95 | FEC'19 |
| 96 | 97 | 98 | 99 | 100 | FEC'20 |
| FEC1 | FEC2 | FEC3 | FEC4 | FEC5 | |

Fig. 4 (Prior Art)

```
 1   2   3   4   5
 6   7   8   9  10
11  12  13  14  15
16  17  18  19  20
21  22  23  24  25
26  27  28  29  30
31  32  33  34  35
36  37  38  39  40
41  42  43  44  45
46  47  48  49  50
51  52  53  54  55
56  57  58  59  60
61  62  63  64  65
66  67  68  69  70
71  72  73  74  75
76  77  78  79  80
81  82  83  84  85
86  87  88  89  90
91  92  93  94  95
96  97  98  99 100
FEC1 FEC2 FEC3 FEC4 FEC5
```

5x20 arrangement

```
 1   2   3   4   5   6   7
 8   9  10  11  12  13  14
15  16  17  18  19  20  21
22  23  24  25  26  27  28
29  30  31  32  33  34  35
36  37  38  39  40  41  42
43  44  45  46  47  48  49
50  51  52  53  54  55  56
57  58  59  60  61  62  63
64  65  66  67  68  69  70
71  72  73  74  75  76  77
78  79  80  81  82  83  84
85  86  87  88  89  90  91
92  93  94  95  96  97  98
FEC6 FEC7 FEC8 FEC9 FEC10 FEC11 FEC12
```

7x14 arrangement

```
 1   2   3   4   5   6   7   8   9
10  11  12  13  14  15  16  17  18
19  20  21  22  23  24  25  26  27
28  29  30  31  32  33  34  35  36
37  38  39  40  41  42  43  44  45
46  47  48  49  50  51  52  53  54
55  56  57  58  59  60  61  62  63
64  65  66  67  68  69  70  71  72
73  74  75  76  77  78  79  80  81
82  83  84  85  86  87  88  89  90
91  92  93  94  95  96  97  98  99
FEC13 FEC14 FEC15 FEC16 FEC17 FEC18 FEC19 FEC20 FEC21
```

9x11 arrangement

Fig. 5

METHOD FOR OPTIMIZING THE FORWARD ERROR CORRECTION SCHEME

This application is a continuation of U.S. patent application Ser. No. 11/853,562, Sep. 11, 2007 now U.S. Pat. No. 8,037,392.

FIELD OF THE INVENTION

The present invention relates to the field of data packet recovering methods. More particularly, the invention relates to a method for reorganizing and optimizing the Forward Error Correction (FEC) scheme in order to achieve a more efficient data packet recovery method while reducing the total overhead of the additional recovery packets.

BACKGROUND OF THE INVENTION

During streaming of video or audio data packets, random congestion may cause packet loss and jitter. Furthermore, the typical high sensitivity of video systems to variations in packet rate transmission also adds to the danger of degradation resulting from data congestion, potential overflow and the resulting packet loss. The data packets that are dropped and lost cause a gap in the video or audio streaming which is highly unacceptable and intolerable. In addition to contending with packet delivery problems, maintaining low latency is a critical constraint for video streaming.

One of the methods used today for packet recovery of lost data packets is the Forward Error Correction (FEC) scheme. The FEC scheme requires adding a fixed percentage of additional packets to a block of data packets such that the loss of one or more data packets in the block, within some predetermined bound, can be recovered by combining the FEC packets with those data packets that had been successfully received in order to reconstruct the missing data packets. The FEC scheme potentially provides a low-latency method for effectively correcting and recovering lost packets especially in situations where the transmission is unidirectional from one source to numerous destinations.

The FEC scheme is defined in Pro-MPEG Code of Practice #3 release 2 July 2004 "Transmission of Professional MPEG-2 Transport Streams over IP Networks". The encoder (i.e. transmitter) inserts FEC packets into the output stream and the decoder (i.e. receiver) uses those FEC packets to reconstruct missing packets in the data sequence it receives, where each FEC packet protecting a group of packets can help recover a single lost packet.

In the standard, XOR is chosen as the error correcting function for FEC, which is computationally very easy to implement. In this example, a XOR function is applied to a sequence of four data packets in order to yield a fifth packet "R":

$$A \otimes B \otimes C \otimes D = R$$

"R" has the ability to recover any one lost packet of the initial four packets it protects, such as recovering packet "A":

$$R \otimes B \otimes C \otimes D = A.$$

Nevertheless, inserting FEC packets into the stream introduces bandwidth overhead and implies latency, since the FEC can be calculated only after all the packets it protects have been produced. Therefore a very important parameter in configuring the FEC scheme is how many FEC packets are needed for protecting a selected batch of data packets, and how to organize the protection of the FEC packets over the data packets.

Variable packet loss rates and variable bit rates, coupled with the need to minimize latency, present an even greater challenge to the implementation of FEC schemes for protecting the data packets. Therefore, the selected FEC scheme, which augments a media stream with redundant data, should be designed to help restore stream integrity based upon anticipated levels of packet loss. The FEC scheme, which groups data packets into a FEC block, produces FEC packets which are said to cover the data packets in that block, since missing data packets can be restored by combining the remaining data packets and FEC packets in that block. FEC coverage, the number of missing data packets that the FEC scheme can recover within the same block, is limited to the number of FEC packets within that block. Therefore, a method is needed for arranging the FEC data packet blocks in order to achieve a reliable packet recovery method without burdening the system with a massive overhead.

The simple and naïve method for using the FEC scheme suggests protecting every few consecutive packets with a FEC packet. However, packet loss due to burst has a high probability of losing a number of consecutive packets, which in this case, may not be recoverable by the protecting FEC packet.

FIG. 1$a$ illustrates another prior art method for using the FEC scheme. This method suggests protecting each block of packets having a constant gap between them with a FEC packet. In other words, the total batch of data packets may be divided into fixed rows of predefined number, whereas the FEC packets are designed each to protect a column. The payload of the $k^{th}$ FEC packet (out of the L) protects the D packets numbered $k+nL$ ($0 \leq n \leq D-1$), where the parameters k, L, D are transmitted in the header of each FEC packet (In the standard, L=Offset, D=NA, k=Base). As illustrated in FIG. 1$a$ an example of 100 data packets are divided into 20 rows, and 5 FEC packets are added, where each FEC packet protects 20 data packets assigned in a column (L=5, D=20). Thus, if the highlighted packets (i.e. 9, 22, 48, 75, and 91) are lost in the transmission, the receiver is able to recover them using the five FEC packets. However, this method is capable of recovering only one lost packet in each column. FIG. 1$b$ illustrates such a case where the highlighted packets are lost and there is no way of recovering them using this prior art method, as some of the columns have more than one lost packet.

US 2006/0029065 discloses a FEC encoding system and method optimized for protecting real-time audio-video streams for transmission over packet-switched networks with minimal latency. The disclosed system and method provide a low-latency FEC scheme for both variable and constant bit-rate MPEG-encoded audio and video streams. To maximize bandwidth-efficiency and playable frame rate for recovered media streams, the disclosed method sorts packets by content type and aggregates them into FEC blocks weighted by sensitivity in the recovered stream to packet loss of a particular content type. However, the described method and system is very complicated and requires the knowledge and identification of the data packets contents.

It is an object of the present invention to provide a method for re-organizing and optimizing the FEC scheme.

It is another object of the present invention to provide a reliable packet recovery method using the FEC scheme.

It is still another object of the present invention to provide a method that achieves a simple and reliable packet recovery method without burdening the system with massive bandwidth overhead.

Other objects and advantages of the invention will become apparent as the description proceeds.

SUMMARY OF THE INVENTION

The present invention relates to a method for optimizing the FEC scheme comprising the steps of: (a) receiving a batch of data packets designated for transmission; (b) choosing a number of divisors having no common denominators in accordance with the said batch of data packets; (c) organizing into blocks said batch of data packets a number of times in accordance with the number of divisors using said divisors; and (d) creating a FEC packet for each of said blocks.

Preferably, the method further comprises the steps of: (e) transmitting the designated batch of data packets together with the created FEC packets to a receiver; and (f) recovering lost data packets of said designated batch using said created FEC packets at said receiver.

Preferably, the divisors are 5, 7, and 9.

In an embodiment the divisors are 5, 6, and 7.

BRIEF DESCRIPTION OF THE DRAWINGS

In the drawings:

FIG. 1a illustrates a prior art method for using the FEC scheme.

FIG. 1b illustrates a prior art method for using the FEC scheme.

FIG. 2 is a table illustrating an example of 100 data packets and their corresponding FEC packets according to another method of a prior art.

FIG. 3 is a table illustrating an example of the same batch of 100 data packets organized in 3 various constellations, and their corresponding FEC packets according to an embodiment of the invention.

FIG. 4 is another table illustrating an example of 100 data packets, and their corresponding FEC packets according to the method of the prior art.

FIG. 5 is another table illustrating an example of 100 data packets, and their corresponding FEC packets according to an embodiment of the invention.

DETAILED DESCRIPTION OF PREFERRED EMBODIMENTS

The term Forward Error Correction (FEC) scheme is used hereinafter to describe an error correction method for data transmission, in which the transmitter sends redundant data packets to a receiver or a number of receivers, for recovering errors in the data flow. The FEC scheme may be used for finding errors in the received data packets, correcting errors in the received data packets, or for replacing lost data packets. The FEC is also defined in Pro-MPEG Code of Practice #3 release 2 July 2004 "Transmission of Professional MPEG-2 Transport Streams over IP Networks".

The error correcting function chosen for FEC is XOR which is computationally very easy to implement. For example, the XOR function applied to a sequence of 4 data packets yields a FEC packet "R":

$$A \otimes B \otimes C \otimes D = R$$

FEC packet R has the ability to recover any one lost packet of the sequence of 4 packets it protects, such as packet "A":

$$R \otimes B \otimes C \otimes D = A$$

Therefore, since each FEC packet is able to recover only one packet in the sequence it protects, the smaller the amount of data packets in the protected sequence, the better the protection of the FEC scheme for error recovery. In extreme cases a FEC packet may be added for each data packet. However, the adding of FEC packets increases bandwidth overhead, which increases cost and latency.

FIG. 2 is a table illustrating an example of 100 data packets and their corresponding FEC packets according to the method of a prior art. In this example the 100 data packets are organized in 5 columns and 20 rows, where each row of data packets is protected by a FEC packet and each column of data packets is protected by a FEC packet, totaling 25 FEC packets. For the sake of brevity, the FEC packets protecting the rows are signed as FEC' and numbered accordingly. Although this method increases bandwidth overhead of 25%, it is widely used for recovering packet loss. For example, if the marked packets 42-47 are lost during the data flow, it is possible to recover these lost packets using the following steps:

1. recovering packet 43 using FEC3,
2. recovering packet 44 using FEC4,
3. recovering packet 45 using FEC5,
4. recovering packet 46 using FEC1,
5. After recovering packet 46, recovering packet 47 using FEC'10,
6. After recovering packets 43, 44, and 45, recovering packet 42 using FEC'9.

However, this prior art method cannot recover a larger amount of lost consecutive packets such as 42-48. Furthermore, this prior art method cannot recover four packets sharing the same rows and columns such as, 43, 44, 48 and 49.

FIG. 3 is a table illustrating an example of the same batch of 100 data packets organized in 3 various constellations, and their corresponding FEC packets according to an embodiment of the invention. These 3 organized constellations are merely a visual representation of the operations made on the same batch of data packets. For sake of brevity, the terms organize, organized, and organizing, are used hereinafter for visually, or conceptually, describing the operations made on a batch of data packets, although in reality no need arises for actually dividing and reorganizing the batch of data packets. In this embodiment the same batch of packets designated for transmission is organized in columns, i.e. divided into groups of packets, for 3 times, prior to transmission. First, the total amount of designated packets is organized in five columns, and a FEC packet is added for every column, meaning, that each column containing a sequence of 20 data packets is protected by one FEC packet. Secondly, the same total amount of designated packets is organized in seven columns, and again a FEC packet is added for protecting each column of packets. In this example constellation, packets 99 and 100 are not protected by a FEC as the total of 100 is not divisible by 7. However, in another embodiment of the invention the last two packets may be protected by the existing FEC packets, such as protecting packet 99 by FEC 6 and protecting packet 100 by FEC 7. In addition, since it is not necessary to have exactly the same 100 packets protected by exactly the same FEC packets, the last two packets may be protected by the FEC packets of the next batch of packets. Lastly, the same total amount of designated packets is organized in nine columns, and again a FEC packet is added for protecting each column of packets (since the total of 100 is not divisible by 9, the last packet may be protected as described before in relation to the second step). In summation, the total batch of data packets is divided, i.e. conceptually organized, into fixed rows of predefined number for 3 times, where the FEC packets are designed to protect a column each. During transmission the batch of packets is sent together with the created FEC packets. In this embodiment, 21 (=5+7+9) FEC packets have been added totaling only 21% of bandwidth overhead, while, in many cases, the sought protection exceeds the protection of prior art methods. For example, assuming the highlighted packets (i.e. 60, 61, 62, 67, 68, 69, 74, 75, 76, 81, 82, and 83) were lost in transmission, using the following steps all the packets can be recovered:

1. recovering packet 61 using FEC19,
2. recovering packet 62 using FEC20,
3. recovering packet 68 using FEC17,
4. recovering packet 75 using FEC15,
5. recovering packet 81 using FEC21,
6. recovering packet 82 using FEC13,
7. recovering packet 60 using FEC5,
8. recovering packet 67 using FEC2,
9. recovering packet 76 using FEC1,
10. recovering packet 83 using FEC3,
11. recovering packet 69 using FEC11,
12. recovering packet 74 using FEC9.

Thus the lost packets are recovered.

In many cases it is also significant to test how many iterations the method requires for recovering the lost packets. For example, when recovering the lost data packets highlighted in FIG. 3 the method of the invention requires only 3 iterations: firstly employing the FEC packets of the 9×11 arrangement, secondly employing the FEC packets of the 5×20 arrangement, and thirdly employing the FEC packets of the 7×14 arrangement.

FIG. 4 is another table illustrating an example of 100 data packets, the highlighted lost packets, and their corresponding FEC packets according to the method of the prior art. In this example the missing packets 31, 36, 37, 42, 43, 48, 49, 54, 55, and 60 form a stairway pattern. In order to recover the lost packets 5 iterations must be made:

1. recovering packets 31 and 60 using the FEC' packets (specifically: FEC'7 and FEC'12),
2. recovering packets 36 and 55 using the FEC packets (specifically: FEC1 and FEC5),
3. recovering packets 37 and 54 using the FEC' packets (specifically: FEC'8 and FEC'11),
4. recovering packets 42 and 49 using the FEC packets (specifically: FEC2 and FEC4),
5. recovering packets 43 and 48 using the FEC' packets (specifically: FEC'9 and FEC'10).

However, the same lost packets may be recovered with less iterations when applying the method of the invention, for example, FIG. 5 illustrates the method of the invention with the same lost packets and their corresponding FEC packets. In order to recover the missing packets 31, 36, 37, 42, 43, 48, 49, 54, 55, and 60 only 3 iterations are required:

1. recovering packets 43 and 48 using the FEC packets of 9×11 arrangement (specifically: FEC19 and FEC15),
2. recovering packets 36, 37, 31, 54, 55, and 60 using the FEC packets of 7×14 arrangement (specifically: FEC6, FEC7, FEC8, FEC10, FEC11, and FEC9),
3. recovering packets 42 and 49 using the FEC packets of 5×20 arrangement (specifically: FEC2 and FEC4).

In one of the embodiments, the order of the iterations is preset in order to minimize the number of iterations. For example, the preset order may be to use the FEC packets of 9×11 arrangement first, then to use the FEC packets of 7×14 arrangement, and lastly to use the FEC packets of 5×20 arrangement. Other preset orders are possible as well.

As understood, other numbers, i.e. divisors, may be used for organizing a batch of data packets into columns other than 5, 7, and 9 for carrying out the invention. However, the essence of the invention lies in choosing the numbers that have no common denominator, since using numbers with common denominators causes overlapping of the protected data packets. For example, if among the chosen divisors are 3 and 9, the 3 FEC packets protecting the 3 columns are totally superfluous as their data packets are already better protected by the 9 FEC packets.

In another embodiment of the invention the numbers, i.e. divisors, for organizing and dividing the group of data packets into columns, are 5, 6, and 7, which have no common denominator and increase the bandwidth overhead by only 18%. In other embodiments, the invention may be carried out with different numbers. In any case, the invention is not limited in any way to a specific set of numbers.

In conclusion, the described optimization of the FEC scheme requires that the numbers used for organizing and dividing a batch of data packets into columns cannot be too large, since that adds too many FEC packets, or too small, since that requires each FEC packet to protect too many data packets, and the chosen numbers cannot have common denominators, since the packets they protect will overlap. Furthermore, many combinations of numbers may be used for organizing the group of data packets into columns. The total group of data packets may be divided more than 3 times or less than 3 times. Therefore, the combination of numbers may contain more or less than 3 numbers having no common denominators, and may vary greatly according to the needs and requirements of the transmitted data packets.

While some embodiments of the invention have been described by way of illustration, it will be apparent that the invention can be carried into practice with many modifications, variations and adaptations, and with the use of numerous equivalents or alternative solutions that are within the scope of persons skilled in the art, without departing from the spirit of the invention or exceeding the scope of the claims.

The invention claimed is:

1. A method for optimizing a forward error correction (FEC) scheme comprising the steps of
   a. receiving a batch of data packets designated for transmission;
   b. choosing a number of divisors having no common denominators with one another, a number of packets in the batch not being divisible by at least one divisor of the number of divisors;
   c. organizing into blocks said batch of data packets a number of times in accordance with the number of divisors using said divisors; and
   d. creating a FEC packet for each of said blocks.

2. The method according to claim 1 further comprising the steps of
   e. transmitting the designated batch of data packets together with the created FEC packets to a receiver; and
   f. recovering lost data packets of said designated batch of data packets using said created FEC packets at said receiver.

3. The method according to claim 1, where the divisors are 5, 7, and 9.

4. The method according to claim 1, where the divisors are 5, 6, and 7.

5. The method according to claim 1, wherein the number of divisors is at least three.

6. The method according to claim 5, wherein the designated batch of data packets includes packets from a previous designated batch of data packets, the number of data packets from the previous designated batch of data packets corresponding to a remainder for a number of data packets in the previous designated batch of data packets divided by the at least one of the at least three divisors that is not a common denominator of the number of packets in the previous designated batch of data packets.

* * * * *